(12) United States Patent
Muchherla et al.

(10) Patent No.: US 11,587,639 B2
(45) Date of Patent: Feb. 21, 2023

(54) VOLTAGE CALIBRATION SCANS TO REDUCE MEMORY DEVICE OVERHEAD

(71) Applicant: MICRON TECHNOLOGY, INC., Boise, ID (US)

(72) Inventors: Kishore Kumar Muchherla, Fremont, CA (US); Mustafa N. Kaynak, San Diego, CA (US); Sivagnanam Parthasarathy, Carlsbad, CA (US); Xiangang Luo, Fremont, CA (US); Peter Feeley, Boise, ID (US); Devin M. Batutis, San Jose, CA (US); Jiangang Wu, Milpitas, CA (US); Sampath K Ratnam, Boise, ID (US); Shane Nowell, Boise, ID (US); Karl D. Schuh, Santa Cruz, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/198,755

(22) Filed: Mar. 11, 2021

(65) Prior Publication Data

US 2022/0293208 A1   Sep. 15, 2022

(51) Int. Cl.
| G11C 29/00 | (2006.01) |
| G11C 29/50 | (2006.01) |
| G06F 12/02 | (2006.01) |
| G11C 16/26 | (2006.01) |
| G11C 29/02 | (2006.01) |
| G11C 7/10  | (2006.01) |

(52) U.S. Cl.
CPC .......... *G11C 29/50* (2013.01); *G06F 12/0246* (2013.01); *G11C 7/1045* (2013.01); *G11C 16/26* (2013.01); *G11C 29/022* (2013.01)

(58) Field of Classification Search
CPC ... G11C 16/34; G11C 11/406; G11C 11/4074; G11C 13/00; G11C 16/10; G11C 5/14; G11C 7/10; G11C 7/22; G11C 16/26; G11C 16/04; G11C 29/02; G11C 29/12; G11C 29/50; G11C 11/34; G11C 11/56; G11C 16/28; G11C 16/30; G11C 16/32; G11C 7/08; G06F 3/06; G06F 12/02; G06F 11/30; G06F 12/06; G06F 12/0802; G06F 12/121; G06F 11/07; G06F 11/10; G06F 12/0882; H01L 27/24
See application file for complete search history.

(56) References Cited

U.S. PATENT DOCUMENTS

| 11,222,704 B1* | 1/2022 | Rayaprolu | .......... G11C 11/4076 |
| 2021/0065813 A1* | 3/2021 | Papandreou | ....... G11C 16/3404 |

\* cited by examiner

*Primary Examiner* — Thong Q Le
(74) *Attorney, Agent, or Firm* — Lowenstein Sandler LLP

(57) ABSTRACT

A voltage calibration scan is initiated. A first value of a data state metric measured for a sample block of a memory device based on associated with a first bin of blocks designated as a current is received. The first value is designated as a minimum value. A second value of the data state metric for the sample block is measured based on a set of read voltage offsets associated with a second bin of blocks having an index value higher than the current bin. In response to determining that the second value exceeds the first value, the first bin is maintained as the current bin and the voltage calibration scan is stopped.

20 Claims, 6 Drawing Sheets

```
Measure RBER of Current_Bin;
Min_RBER = RBER of Current_Bin;
Selected_Bin = Current_Bin;
for (i= Current_Bin+1; i <= Max_Bin; i++) {
    Measured_RBER = RBER measured at Bin[i] set of read offsets;
    if(Measured_RBER <= Min_RBER)
        Selected_Bin = i;
        Min_RBER = Measured_RBER;
    else
        break; //stop the scan
}
```

VOLTAGE CALIBRATION SCANS TO REDUCE MEMORY DEVICE OVERHEAD

TECHNICAL FIELD

Embodiments of the disclosure relate generally to memory sub-systems, and more specifically, relate to voltage calibration scans to reduce memory device overhead.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
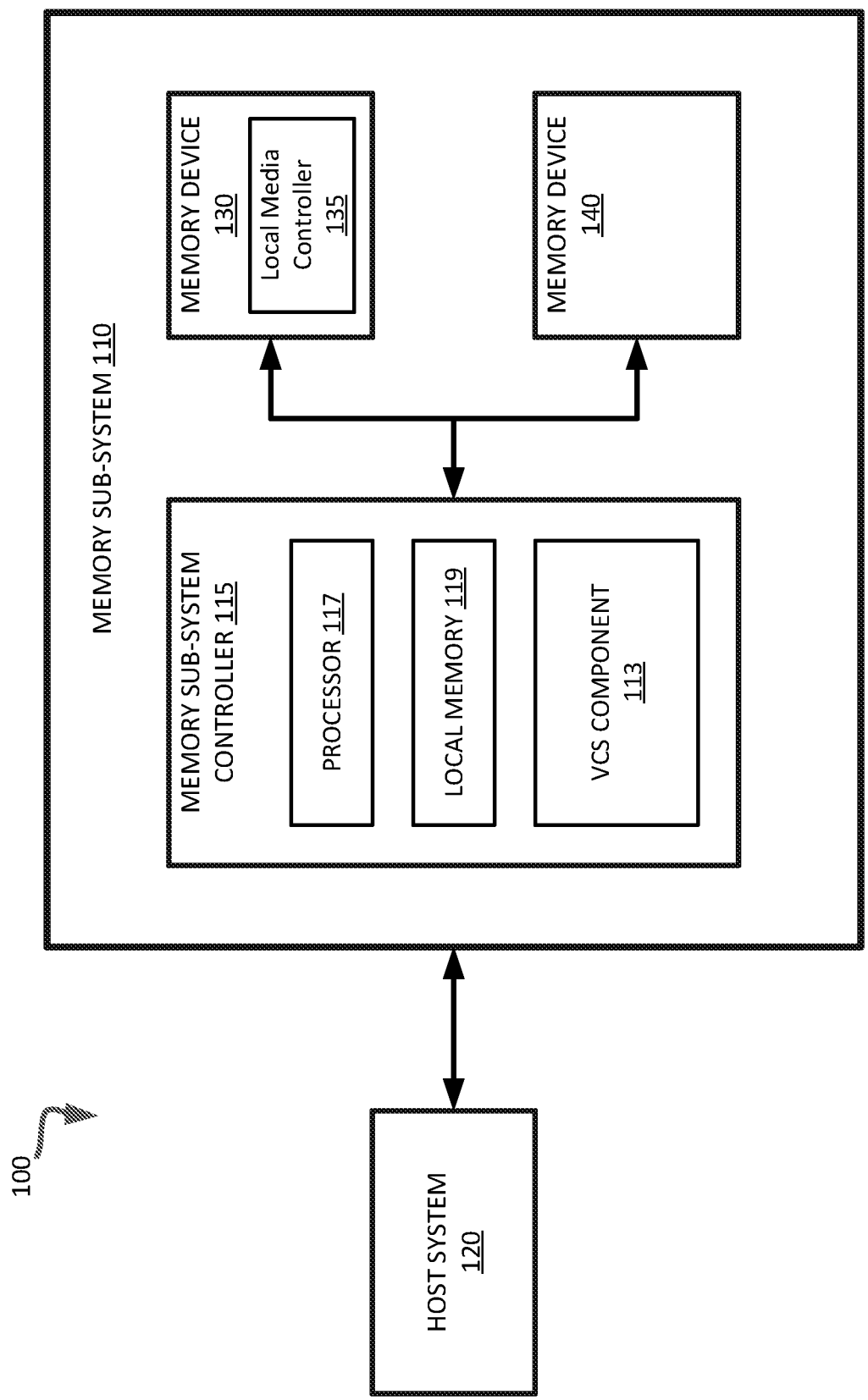
FIG. 1 illustrates an example computing system that includes a memory sub-system in accordance with some embodiments of the present disclosure.

Aspects of the present disclosure are directed to voltage calibration scans to reduce memory device overhead. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

A memory cell can be programmed (written to) by applying a certain voltage to the memory cell, which results in an electric charge being held by the memory cell, thus determining a voltage signal $V_{CG}$ that has to be applied to a control electrode or control gate of the cell to open the cell to the flow of electric current across the cell, between the source electrode and the drain electrode. More specifically, for each individual memory cell (having a charge Q stored thereon) there can be a threshold voltage $V_t$ such that the source-drain electric current is low for the control gate voltage ($V_{CG}$) being below the threshold voltage, $V_{CG}<V_t$. The current increases substantially once the control gate voltage has exceeded the threshold voltage, $V_{CG}>V_t$. Because the actual geometry of the electrodes and gates varies from cell to cell, the threshold voltages can be different even for cells programmed to the same logical value on the same die. The memory cells can, therefore, be characterized by a distribution P of the threshold voltages, $P(Q,V_t)=dW/dV_t$, where dW represents the probability that any given cell has its threshold voltage within the interval $[V_t,V_t+dV_t]$ when charge Q is placed on the cell.

A memory device can have distributions $P(Q,V_t)$ that are narrow compared with the working range of voltage windows tolerated by the cells of the device. Accordingly, multiple distributions $P(Q_k,V_t)$ (with "valleys" between distributions) can be fit into the working voltage window allowing storing and reliably detecting multiple bits per cell, such as $2^3=8$ distributions (7 valleys) for a TLC, $2^2=4$ distributions (3 valleys) for an MLC, etc. The distributions are interspersed with voltage intervals ("valley margins") between distributions where none (or very few) of the memory cells of the device have their threshold voltages. Such valley margins can, therefore, be used to separate various charge states $Q_k$—the logical state of the cell can be determined by detecting, during a read operation by applying read voltages corresponding to each valley. This effectively allows a single memory cell to store multiple bits of information: a memory cell operated with $2^N$ distributions ("levels") is capable of storing N bits of information. During the read operation, $2^{N-1}$ read voltages can be applied to distinguish the $2^N$ distributions. Specifically, the read operation can be performed by comparing the measured threshold voltage $V_t$ exhibited by the memory cell to one or more reference voltage levels corresponding to known valleys (e.g., centers of the valley) of the memory device.

Due to the phenomenon known as storage charge loss or slow charge loss, $V_t$ of a memory cell can change over time and/or temperature as the electric charge of the cell is degrading, which is also referred to as "temporal voltage shift" (since the degrading electric charge causes the voltage distributions to shift along the voltage axis towards lower voltage levels). The $V_t$ can change rapidly at first (immediately after the memory cell was programmed), and then slow down in an approximately logarithmic linear fashion with respect to the time elapsed since the cell programming event. Accordingly, failure to mitigate the temporal voltage shift caused by the slow charge loss can result in the increased bit error rate in read operations.

Read offsets bins, referred to as "bins," can be instantiated for grouping families of blocks that—by virtue of proximity in their programming times and/or temperatures—are likely to have similar $V_t$ distribution shifts and thus are likely to call for similar read voltage offsets each corresponding to a valley during read operations. Each of the bins can be associated with a set of read voltage offsets for read operations that involve memory partitions (e.g., blocks, pages, planes, or any other partitions). For example, for TLC blocks storing 3 bits, there can be 8 data states (i.e., levels) and 7 valleys. Hence each bin for TLC blocks can be associated with a set of 7 read offsets, with one read offset for each valley. The associations of blocks with dies and with bins can be stored in respective metadata tables maintained by a memory sub-system controller. If a sample block is assigned to a particular bin associated with a set of read voltage offsets used to measure the value of a data state metric as time increases, the sample block is expected to eventually be reassigned to another bin having a higher index number due to $V_t$ distribution shift.

Voltage calibration scans (e.g., read voltage calibration) can be performed periodically to address temporal voltage shift for a block by assigning the block to a proper bin. More specifically, to perform the voltage calibration scan, one or more pages of a block can be sampled ("sampled pages"), and a data state metric value can be measured at different read voltage offsets corresponding to respective ones of the bins. The block can then be assigned to the bin with an appropriate data state metric value. The data state metric can have values that changes with, e.g., time and/or temperature, in which $V_t$ distributions shift as charge diminishes over, e.g., time and/or temperature. For example, time can be measured as time after programming (TAP) and/or the time between a data write and a data read (e.g., write-read delay). A variety of data state metrics can be used as the basis of a voltage calibration scan to determine an appropriate bin for a block.

One example of a data state metric is raw bit error rate (RBER). More specifically, a memory device can produce bit errors associated with erroneous or corrupted bits, which can be correctable by employing error-correcting codes (ECC), and the RBER can be defined as a failed bit count (e.g., a number of failed bits per number of total bits). For example, to determine the value of RBER for a sample block using a read operation, a hardware read circuit of the memory sub-system can apply a set of read voltages $V_j+\Delta V_j$ that can differ from the base read voltages $V_j$ by the state-dependent offsets $\Delta V_j$ to minimize errors induced by $V_t$ distribution shifts. For example, in the case of RBER, read voltage calibration can be performed to keep the RBER in check.

However, RBER measurements involve transferring data from, e.g., the NAND to an application-specific integrated circuit (ASIC). Moving the RBER measurement data via a bus or interface (e.g., ONFI bus) can cause collisions with host data. That is, the transfer of the RBER measurement data can incur a transfer penalty. To address this, instead of RBER, another example of a suitable data state metric having a smaller data size that can be used to implement the voltage calibration scans described herein is distance to an optimal valley of a $V_t$ distribution after programming. More specifically, if programming occurs at time 0, the optimal valley can correspond to the optimal or most desired read $V_t$ of the $V_t$ distribution at time T after programming (e.g., at an intersection of two curves of the $V_t$ distribution). For each bin, a bin offset can be measured, and the distance to the optimal valley can be determined as the distance between the bin offset and the optimal valley (e.g., absolute value of the difference between the bin offset and the optimal valley). The bin corresponding to the shortest distance to the optimal valley of the $V_t$ distribution after programming (i.e., the closest bin offset) is assigned as the appropriate bin. The distance data can have a size of only a few bytes, and thus can be used to avoid the transfer penalty associated with RBER as a data state metric.

However, various voltage calibration scan methodologies fail to adequately address the temporal voltage shift and/or employ inefficient strategies. For example, in a brute force approach, the one or more sampled pages can be tested for "all" bins, and the block corresponding to the one or more sampled pages can be assigned to the bin that corresponds to the optimal data state metric value. However, voltage calibration consumes bandwidth, contributes to performance loss and can lead to poor Quality of Service. Therefore, memory device performance can be improved by minimizing voltage calibration overhead associated with the brute force approach.

Aspects of the present disclosure address the above and other deficiencies by implementing voltage calibration scans that reduce memory device overhead by performing voltage calibration using fewer read voltage offset measurements compared to other common implementations (e.g., brute force approaches). More specifically, instead of measuring a value of a data state metric for a chosen block at every bin, as would have been done in the brute force approach described above, the voltage calibration scans described herein exploit the observed monotonic or one-directional valley shifts towards lower voltages by starting the voltage calibration scan for the chosen block from the current bin associated with the block (the block-to-bin mapping metadata may be stored for at least a subset of blocks of the memory device), rather than necessarily from the absolute first bin. The method initializes the index of the tentative bin to the index of the current bin incremented by one, and further initializes the minimum data state metric value to the data state metric value of the current block measured using the read voltage offset associated with the current bin associated with the block. The method then iterates through the bins. At every iteration, the new data state metric value for the chosen block is determined using the read voltage offset associated with the tentative bin. If the new data state metric value falls below the minimum data state metric value, the current bin index is advanced to the tentative bin index, and the minimum data state metric value is updated to the new data state metric value. Upon incrementing the tentative bin index, the next iteration of the method is performed. Otherwise, if the new data state metric value exceeds the minimum data state metric value, the voltage calibration scan stops. Accordingly, a block can be associated to higher index bins over time without relapsing to older bins.

Advantages of the present disclosure include, but are not limited to, calibration overhead minimization, improved Quality of Service (QoS), and improved memory device performance.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDEVIM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes voltage calibration scan (VCS) component 113. In some embodiments, the memory sub-system controller 115 includes at least a portion of the VCS scan component 113. In some embodiments, the VCS scan component 113 is part of the host system 110, an application, or an operating system. In other embodiments, local media controller 135 includes at least a portion of VCS scan component 113 and is configured to perform the functionality described herein.

The VCS component 113 can perform voltage calibration scans in accordance with the embodiments described herein. More specifically, instead of measuring a value of a data state metric value for every bin in a brute force approach, the VCS component 113 can receive an indication of a current bin, measure a data state metric value associated with the current bin, and measure a data state metric value associated with a tentative bin having a higher index than the current bin. For example the VCS component 113 can measure the data state metric value associated with the tentative bin by scanning one or more sampled pages using a set of read voltage offsets corresponding to the second bin. The identity of the current bin can be stored in non-volatile memory operatively coupled to the memory sub-system 110 (e.g., memory device 130 or 140, or some other external memory device). Further, the data state metric value can be measured by scanning one or more sampled pages of a block using a set of read voltage offsets corresponding to the bin. In some embodiments, the data state metric value is an RBER value. In other embodiments, the data state metric value is a distance to the optimal valley of a $V_t$ distribution after programming. Further details regarding measuring data state metric values (e.g., RBER and distance to the optimal valley of a $V_t$ distribution after programming) will be described below with reference to FIGS. 2-6.

Since the value of the charge loss is one-directional or monotonic, the VCS component 113 can control the voltage calibration scan by comparing the minimum data state metric value associated with the current bin to the data state metric value associated with the tentative bin. More specifically, the voltage calibration scan can be stopped in response to determining that the data state metric value associated with the tentative bin is higher than the data state metric value associated with the current bin. In response to determining that the data state metric value associated with the tentative bin is less than the data state metric value associated with the current bin, the VCS component 113 can update the tentative bin as the current bin. Examples of data state metric values include, but are not limited to, RBER and voltage offset distance. Further details with regards to the operations of the VCS component 113 are described below with reference to FIGS. 2-6.

Figure 2:
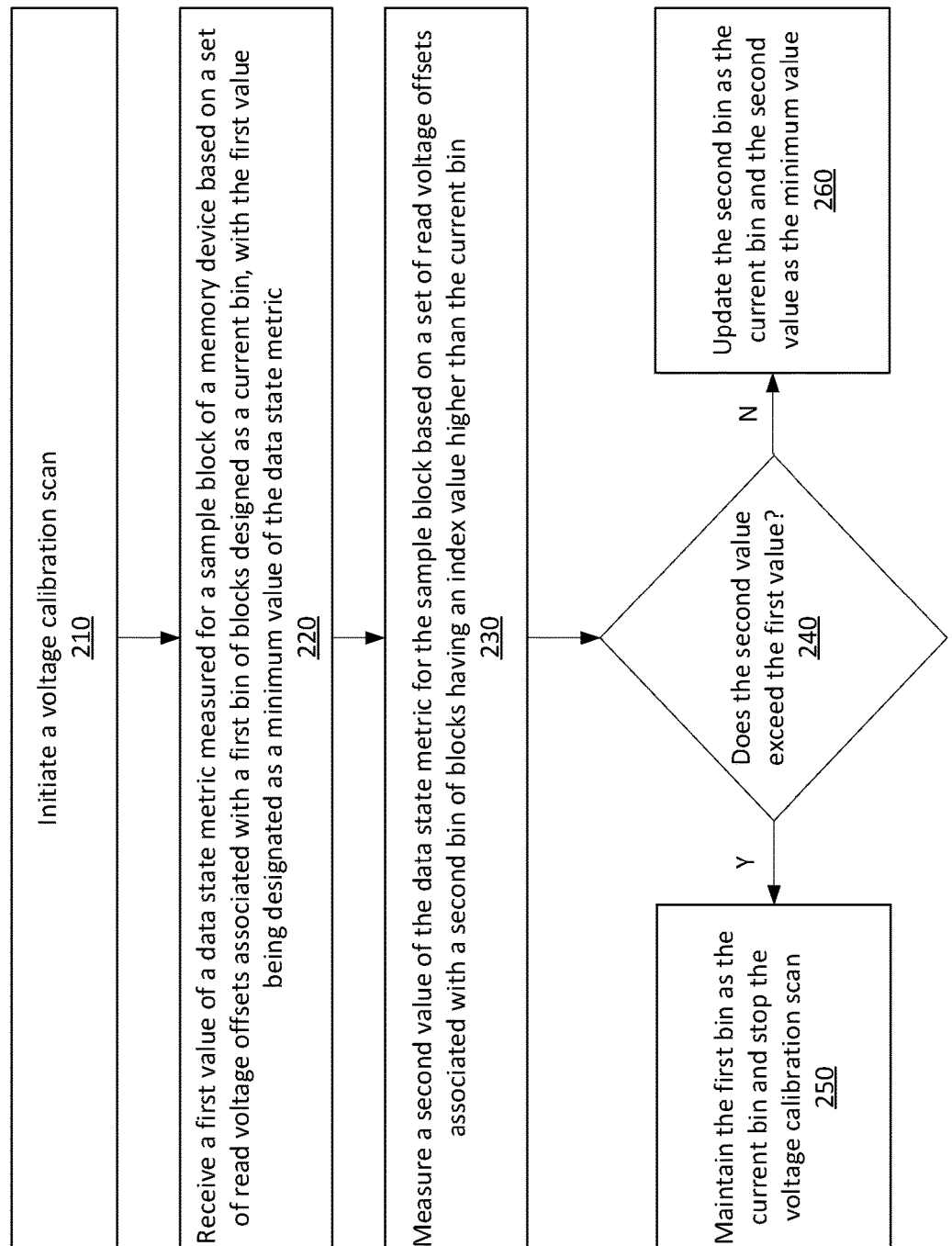
FIG. 2 is a flow diagram of an example method for performing a voltage calibration scan in accordance with some embodiments of the present disclosure.

FIG. 2 is a flow diagram of an example method 200 to perform a voltage calibration scan, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the VCS component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic initiates a voltage calibration scan.

At operation 220, the processing logic receives a first value of a data state metric measured for a sample block based on a set of read voltage offsets associated with a first bin of blocks designated as a current bin, with the first value being designated as a minimum value of the data state metric. In some embodiments, receiving the first value of the data state metric includes measuring the first value of the data state metric. The first value can be measured by scanning one or more pages of the sample block based on the set of read voltage offsets associated with the first bin. In some embodiments, the current bin can be an absolutely first bin having a lowest index value among a group of bins. In other embodiments, the current bin can have an index value higher than at least one other bin of a group of bins. The identity of the current bin can be stored in non-volatile memory to provide protection from power-loss events. As will be described in further detail below with reference to FIG. 3, each set of read voltage offsets can include any suitable number of read voltage offset values in accordance with the embodiments described herein. For example, each set of read voltage offsets can include 7 total read voltage offset values.

At operation 230, the processing logic measures a second value of the data state metric for the sample block based on a set of read voltage offsets associated with a second bin of blocks having an index value higher than the first bin. More specifically, the second value can be measured by scanning the one or more pages of the sample block based on the set of read voltage offsets corresponding to the second bin. The bins are reflective of the one-directional movement of the charge loss, i.e., monotonically increasing charge loss. Thus, the data state metric is any suitable metric that can determine, in view of the monotonic increasing charge loss, the bin that delivers the lowest value by picking the set of read offsets that best match the current $V_t$ shift of the sample block. Any suitable data state metric can be used to obtain the first and second values in accordance with the embodiments described herein.

In some embodiments, the data state metric is RBER, and the first and second values are first and second RBER values, respectively. For example, in the embodiments in which the data state metric is RBER, measuring the first value and/or the second value can include scanning the one or more sampled pages by applying the set of read voltage offsets associated with the first bin and/or the second bin to determine an RBER value for the first bin and/or the second bin. For example, the RBER value can be an aggregate RBER value such as, e.g., an average RBER value among sampled reads, a minimum RBER value among sampled reads, or a maximum RBER value among sampled reads. Further details describing how to measure RBER values will be described below with reference to FIGS. 3, 4 and 6.

However, RBER measurements involve transferring data from, e.g., the NAND to an application-specific integrated circuit (ASIC). Moving the RBER measurement data via a bus or interface (e.g., ONFI bus) can cause collisions with host data. That is, the transfer of the RBER measurement data can incur a transfer penalty. To address this, the data state metric can in some embodiments be a distance to an optimal valley of a $V_t$ distribution that has shifted some time after programming ("optimal valley"), and the first and second values are distances to the optimal valley corresponding to the first and second bins, respectively.

More specifically, programming occurring at time 0 can result in an initial $V_t$ distribution having an associated initial $V_t$ distribution position located within the valley of the initial $V_t$ distribution position (e.g., at the intersection of a pair of curves of the initial $V_t$ distribution). After some time T after programming, the initial $V_t$ distribution can shift, resulting in a shifted $V_t$ distribution. A shifted $V_t$ distribution position can be located within the optimal valley of the shifted $V_t$ distribution (e.g., at the intersection of two curves of the shifted $V_t$ distribution). For each bin, a bin $V_t$ position can be determined relative to the initial $V_t$ distribution (e.g., a difference between the initial $V_t$ distribution position and bin offsets), and a distance to the optimal valley for a bin can be determined as the distance between its corresponding bin $V_t$ position and the shifted $V_t$ distribution position (e.g., absolute value of the difference). Further details describing how to measure distances to the optimal valley will be described below with reference to FIGS. 3-5.

Similarly, in other embodiments, other suitable data state metrics can be defined in accordance with the embodiments described herein. At operation 240, it is determined whether the second value exceeds the first value. If so, this means that the set of read voltage offsets associated with the second bin is not suitable for block assignment as the set of offsets for the second bin are more than the actual shift for the block, and the set of offsets for the first bin is a better match for the actual shift for the block. Thus, in response to determining that the second value exceeds the first value at operation 240 (e.g., greater than the first value), the first bin is maintained as the current bin and the voltage calibration scan is stopped at operation 250. Otherwise, at operation 260, the second bin is updated as the current bin and the second value is updated as the minimum value in response to determining that the second value is less than or equal to the first value. Thus, if another voltage calibration scan is performed after operation 260, then the voltage calibration scan performed by the system can begin based on the updated current bin, and the voltage calibration scan can ignore the bins having index values below that of the updated current bin.

For example, in the embodiments in which the data state metric is RBER, if the RBER value corresponding to the second bin exceeds the RBER value corresponding to the first bin, then the first bin is maintained as the current bin and the voltage calibration scan is stopped. Otherwise, if the RBER value corresponding to the second bin is less than or equal to the RBER value corresponding to the first bin, then the second bin is updated as the current bin.

As another example, in the embodiments in which the data state metric is the distance to the optimal valley, the bin corresponding to the $V_t$ position having the smallest distance to the optimal valley (i.e., the closest bin offset) is assigned as the appropriate bin. Thus, if the distance corresponding to the second bin exceeds the distance corresponding to the first bin, then the first bin is maintained as the current bin and the voltage calibration is stopped. Otherwise, if the distance corresponding to the second bin is less than or equal to the distance corresponding to the first bin, then the second bin is updated as the current bin. As an example, assume that the optimal valley is at 140 mV, the read threshold using bin offset for the first bin is 80 mV, and the read threshold using bin offset for the second bin is 160 mV. Since |80−140|=60>|160−140|=20 mV, the second bin is determined to correspond to a smaller distance, and thus second bin is updated as the current bin. The distance data can have a size of only a few bytes, and thus can be used to avoid the transfer penalty associated with RBER as a data state metric.

If the calibration scan is not executed very often, then it is possible that, between consecutive calibration scans, the best bin might have an index value of one more than one higher than the current bin. Hence for this case, the process of FIG. 2 can be executed until we reach operation 260 i.e., the RBER with second bin is higher which indicates that the flow found the bin that resulted in lowest RBER. Accordingly, the process performed by the method 200 can be used to efficiently perform voltage calibration scans by dynamically updating the current bin over time, thereby reducing memory device overhead relative to a brute force approach.

Figure 3:
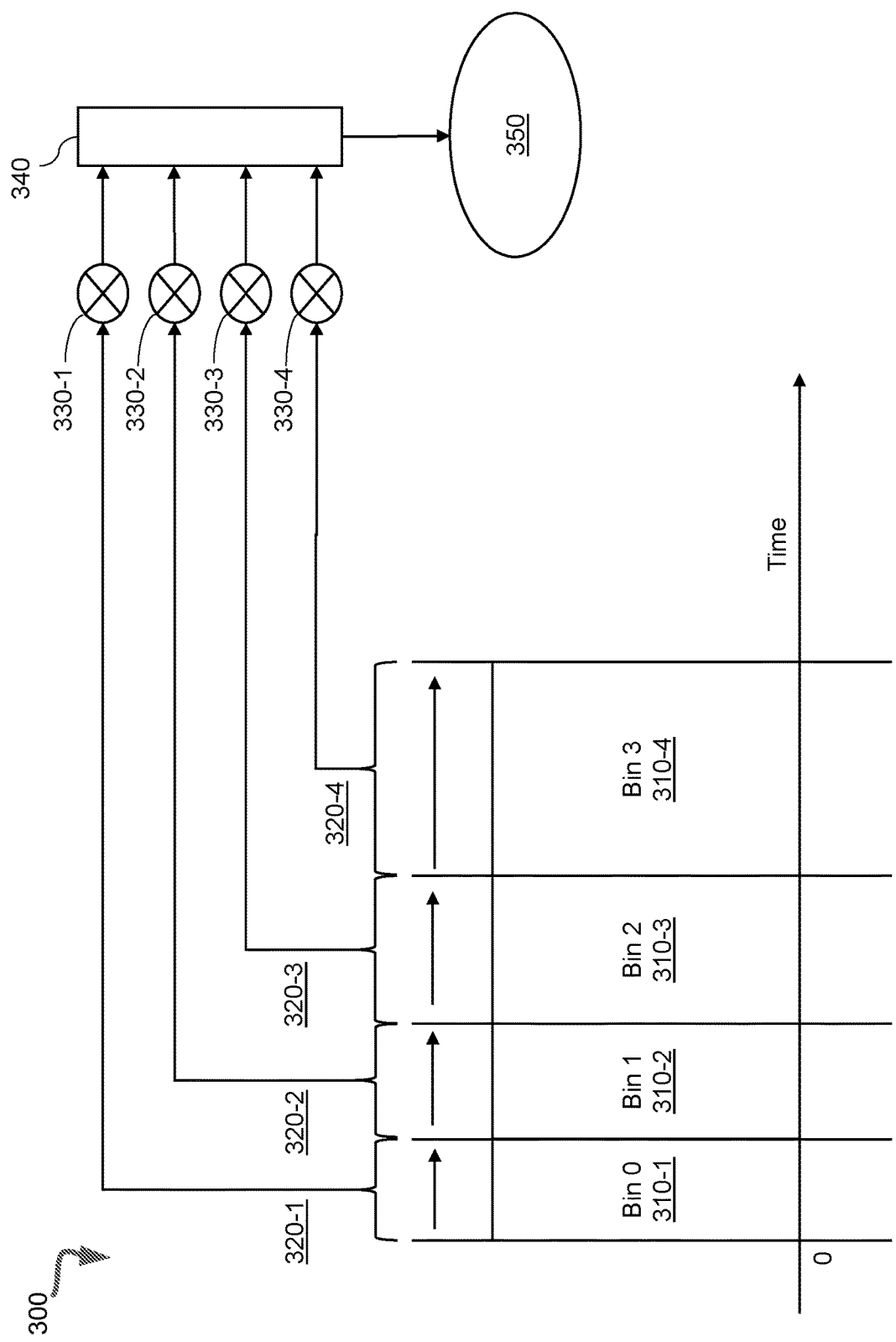
FIG. 3 is a diagram of an example system that can be used to perform a voltage calibration scan in accordance with some embodiments of the present disclosure.

FIG. 3 illustrates a system 300 that can be used to perform a voltage calibration scan in accordance with some embodiments of the present disclosure. As shown, the system includes a number of bins 310-1 through 310-4. In this illustrative example, bin 310-1 corresponds to a first bin having an index value of 0 (Bin 0) bin 310-2 corresponds to a second bin having an index value of 1 (Bin 1) bin 310-3 corresponds to a third bin having an index value of 2 (Bin 2), and bin 310-4 corresponds to a fourth bin having an index value of 3 (Bin 3). That is, in this illustrative example, the bin 310-1 is an absolute first bin. However, in other embodiments, the bin 310-1 can be a relative first bin, such that there exists at least one bin having an index value lower than bin 310-1. Although the number of bins shown in this example is 4, the system 300 can include any suitable number of bins in accordance with the embodiments described herein. In some embodiments, the system 300 includes between 5 bins and 10 bins. The width of each of the bins 310-1 through 310-4 is not depicted to scale.

The bins 310-1 through 310-4 are each associated with respective sets of read voltage offsets 320-1 through 320-4 determined based on time. More specifically, the time can be time after programming (TAP) or a write-read delay, which corresponds to a time delay between a data write and a data read. Each set of read voltage offsets 320-1 through 320-4 can include any suitable number of read voltage offset values in accordance with the embodiments described herein. More specifically, each set of read voltage offsets can be denoted as $\{R_{1,k}, \ldots, R_{i,j}\}$, where i is the number of read voltage offsets and j is the bin number. For example, if each of the sets of read voltage offsets 320-1 through 320-4 includes 7 total read voltage offset values, the set of read voltage offsets 320-1 corresponding to the bin 310-1 (Bin 0) can be denoted as $\{R_{1,0}, R_{2,0}, \ldots, R_{7,0}\}$, the set of read voltage offsets 320-2 corresponding to the bin 310-2 (Bin 1) can be denoted as $\{R_{1,1}, R_{2,1}, \ldots, R_{7,1}\}$, etc.

Each of the sets of read voltage offsets 320-1 through 320-4 can be used to scan one or more pages of a sample block to obtain respective measurements 330-1 through 330-4 of values of a data state metric. For example, the data state metric can be RBER, a distance to an optimal valley of a $V_t$ distribution after programming ("optimal valley"), etc. Thus, at least two of the measurements 330-1 through 330-4 can be fed into a measurement comparison component 340 to select a lowest measurement among the measurements 330-1 through 330-4. The bin corresponding to the lowest measurement can then be allocated to the block.

Due to $V_t$ distribution shift, the association of a given block with respect to one of bins 310-1 through 310-4 changes as a function of time, temperature and/or number of program erase cycles. As an illustrative example, if bin 310-2 is determined to be a current bin associated with a minimum value of a data state metric, as described herein above with reference to FIG. 2, then the voltage calibration scan performed by the system 300 need not begin at bin 310-1. Rather, the voltage calibration scan can measure a value of the data state metric at bin 310-2 to update the value, and at bin 310-3 to determine if that value exceeds the minimum value for the current bin 310-2. If it does, then bin 310-2 remains the current bin and the voltage calibration scan stops. Otherwise, bin 310-3 is updated as the current bin and the value measured for bin 310-3 is updated as the minimum value and, if another voltage calibration scan is performed afterwards, then the voltage calibration scan performed by the system need not begin at either bin 310-1 or bin 310-2. The process performed by the system 300 can be used to efficiently perform voltage calibration scans by dynamically updating the current bin over time, thereby reducing memory device overhead relative to a brute force approach.

Figure 4:
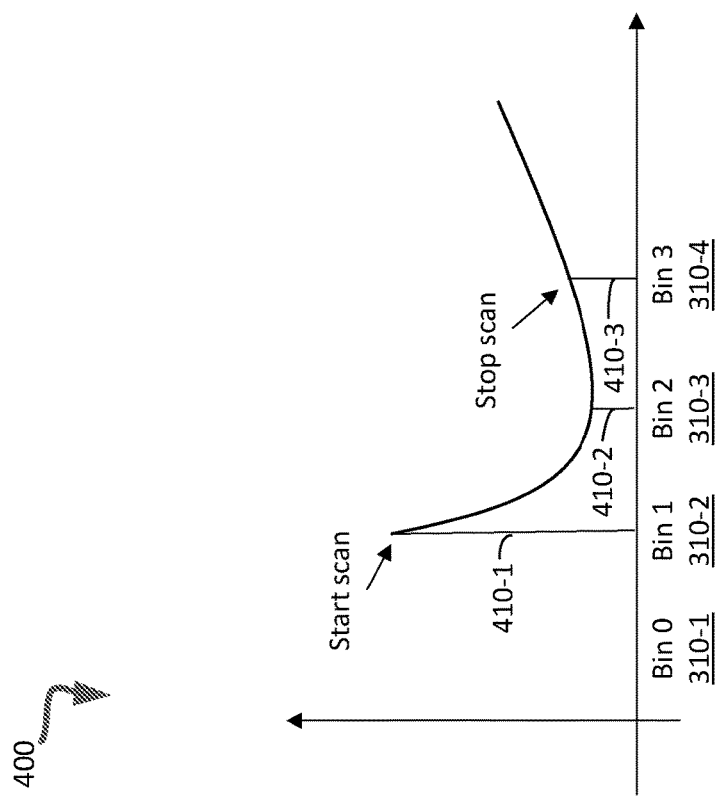
FIG. 4 is a graph illustrating a scan starting and stopping with respect to the bins of the system of FIG. 3.

FIG. 4 is a graph 400 illustrating voltage calibration scan starting and stopping with respect to the bins 310-1 through 310-4 (Bin 0 through Bin 3) of FIG. 3. The x-axis represents read voltage offsets, which can correspond to respective bins, and the y-axis represents a data state metric value (e.g., RBER, distance to an optimal valley). It is assumed that bin 310-2 corresponding to Bin 1 is the current bin, which can be stored in non-volatile memory to maintain a continuous record across power loss events. Accordingly, the scan does not start from bin 310-1 (Bin 0).

The scan starts by applying the set of read voltage offsets corresponding to the bin 310-2 (e.g., set of read voltage offsets 320-2 of FIG. 3) to obtain a first value 410-1. Then, the scan moves to apply the set of read voltage offsets corresponding to the bin 310-3 (Bin 2) (e.g., set of read voltage offsets 320-3 of FIG. 3) to obtain a second value 410-2. Since the second value 410-2 is less than the first value 410-1, bin 310-3 replaces the bin 310-2 as the current bin and the second value 410-2 replaces the first value 410-1. The scan continues by seeing if the block should be assigned to a higher bin. Thus, the scan moves to apply the set of read voltage offsets corresponding to the bin 310-4 (Bin 3) (e.g., set of read voltage offsets 320-4 of FIG. 3) to obtain a third value 410-3. However, in this case, the third value 410-3 is greater than the second value 410-2. The means that the set of read voltage offsets corresponding to bin 310-4 is not suitable for block assignment. Accordingly, the scan determines that bin 310-3 (Bin 2) is the current bin and the scan stops.

Figure 5:
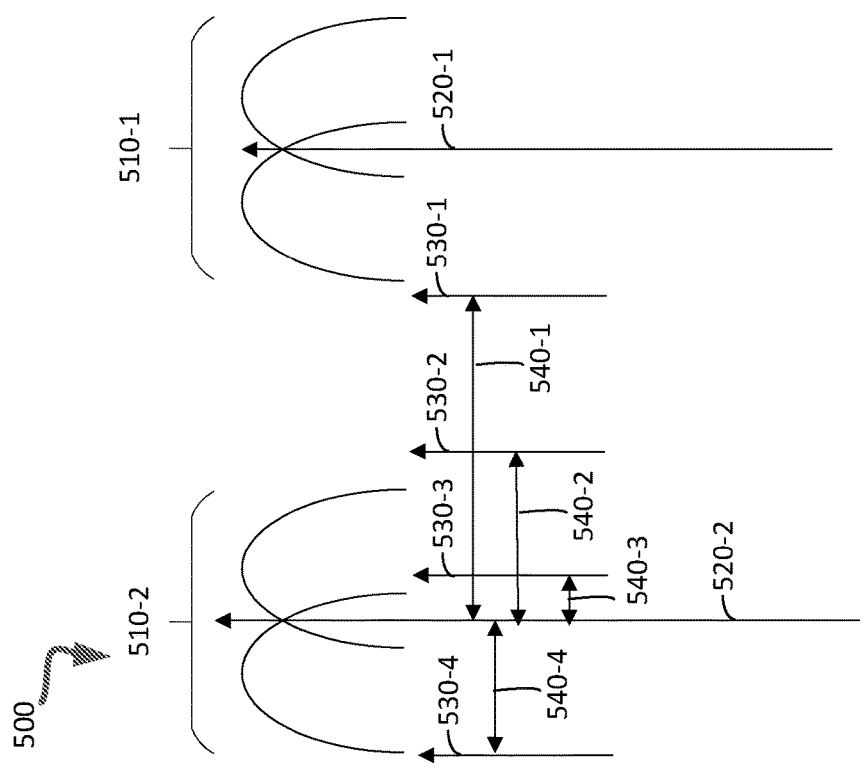
FIG. 5 is a diagram illustrating the measurement data state metric corresponding to a distance to an optimal valley in accordance with some embodiments of the present disclosure.

FIG. 5 is a diagram 500 illustrating the measurement of a data state metric corresponding to a distance to an optimal valley that can be used to perform a voltage calibration scan in accordance with some embodiments of the present disclosure. As shown, the diagram 500 includes an initial $V_t$ distribution 510-1. The initial $V_t$ distribution 510-1 corresponds to the $V_t$ distribution right after programming at time 0. An initial $V_t$ distribution position 520-1 corresponding to a $V_t$ value within the valley of the initial $V_t$ distribution 510-1 (e.g., at the intersection of the curves shown in the initial $V_t$ distribution 510-1) is shown.

Read offset data for a number of bins can be sent by a memory sub-system controller (e.g., SSD controller) to a memory device (e.g., NAND memory device). A number of bin $V_t$ positions corresponding to $V_t$ values associated with respective bins can be identified by the memory device based on the read offset data and the first $V_t$ distribution position 520-1. For example, as shown, the bin $V_t$ positions can include a first bin $V_t$ position 530-1 associated with a first bin (Bin 1), a second $V_t$ position 530-2 associated with a second bin (Bin 2), a third $V_t$ position 530-3 associated with a third bin (Bin 3), and a fourth $V_t$ position 530-1 associated with a fourth bin (Bin 4). More specifically, the $V_t$ position for a given bin can be calculated based on the read offset data corresponding to the given bin and the initial $V_t$ distribution position 520-1. If the read offset data corresponding to the given bin is positive, the read offset data corresponding to the given bin can be subtracted from the initial $V_t$ distribution position 520-1 to obtain the $V_t$ position associated with the given bin. If the read offset data corresponding to the given bin is negative, the read offset data corresponding to the given bin can be added to the initial $V_t$ distribution position 520-1 to obtain the $V_t$ position associated with the given bin.

The memory device can internally generate a shifted $V_t$ distribution 510-2 representing the shift of the initial $V_t$ distribution 510-1 at some time T after programming. The shifted $V_t$ distribution is unconditional because there is no notion of binary values in the memory device. The memory device can identify a shifted $V_t$ distribution position 520-2 corresponding to a $V_t$ value within an optimal valley of the shifted $V_t$ distribution 510-2 ("optimal valley") based on population information. The memory device has a number of ways to quickly and efficiently locate the optimal valley of the shifted $V_t$ distribution 510-2. For example, the optimal valley of the $V_t$ distribution after programming can be located based on the 50% population point, or the memory device can use the $V_t$ histograms to locate the optimal valley. Then, the memory device can compute distances to the optimal valley of the shifted $V_t$ distribution position 520-2 with respect to each of the bin $V_t$ positions 530-1 through 530-4 (e.g., the absolute values of the differences). More specifically, a distance 540-1 corresponds to Bin 1, a distance 540-2 corresponds to Bin 2, a distance 540-3 corresponds to Bin 3, and a distance 540-4 corresponds to Bin 4.

In some embodiments, the bin corresponding to the smallest distance to the optimal valley is determined by the memory device, and information identifying the bin (e.g., bin index) sent to the memory sub-system controller. In other embodiments, the distances to the optimal valley computed by the memory device are sent to the memory sub-system controller, and the memory sub-system controller can use the received distances to the optimal valley to determine the bin corresponding to the smallest distance to the optimal valley. In this illustrative example, the distance 540-3 is the smallest distance, and so Bin 3 is determined to be the bin corresponding to the smallest distance to the optimal valley.

Figure 6:
FIG. 6 is exemplary pseudocode describing a method for performing a voltage calibration scan in accordance with some embodiments of the present disclosure.

FIG. 6 illustrates exemplary pseudocode 600 for performing a voltage calibration scan in accordance with some embodiments of the present disclosure. In this illustrative example, the voltage calibration scan is based on RBER measurements of RBER values. For example, RBER measurements can refer to making multiple page reads from the block and determining an aggregate RBER value such as average, minimum etc. However, such an example should not be considered limiting, and any suitable data state metric can be used. For example, distance to the optimal valley can be used.

As shown, for an index value of a current bin associated with a block of a memory device (variable "Current_Bin"), the RBER corresponding to the current bin is measured to obtain a measured RBER (variable "RBER of current_Bin"). The variable "Min_RBER" is initialized as "RBER of Current_Bin" and the variable "Selected_Bin" is an index value initialized as "Current_Bin". A variable "i" is a post-incremented counter defined as "Current_Bin"+1. For "i" being less than or equal to the index value of the bin having the highest index value ("Max_Bin"), the RBER is measured at the Bin[i] set of read offsets, and set to the variable "Measured_RBER." If "Measured_RBER" is less than or equal to "Min_RBER", this means that "Selected_Bin" and "Min_RBER" need to be updated. That is, "Selected_Bin" is updated with "i" and "Min_RBER" is updated with "Measured_RBER." Otherwise, the scan is stopped or terminated.

Figure 7:
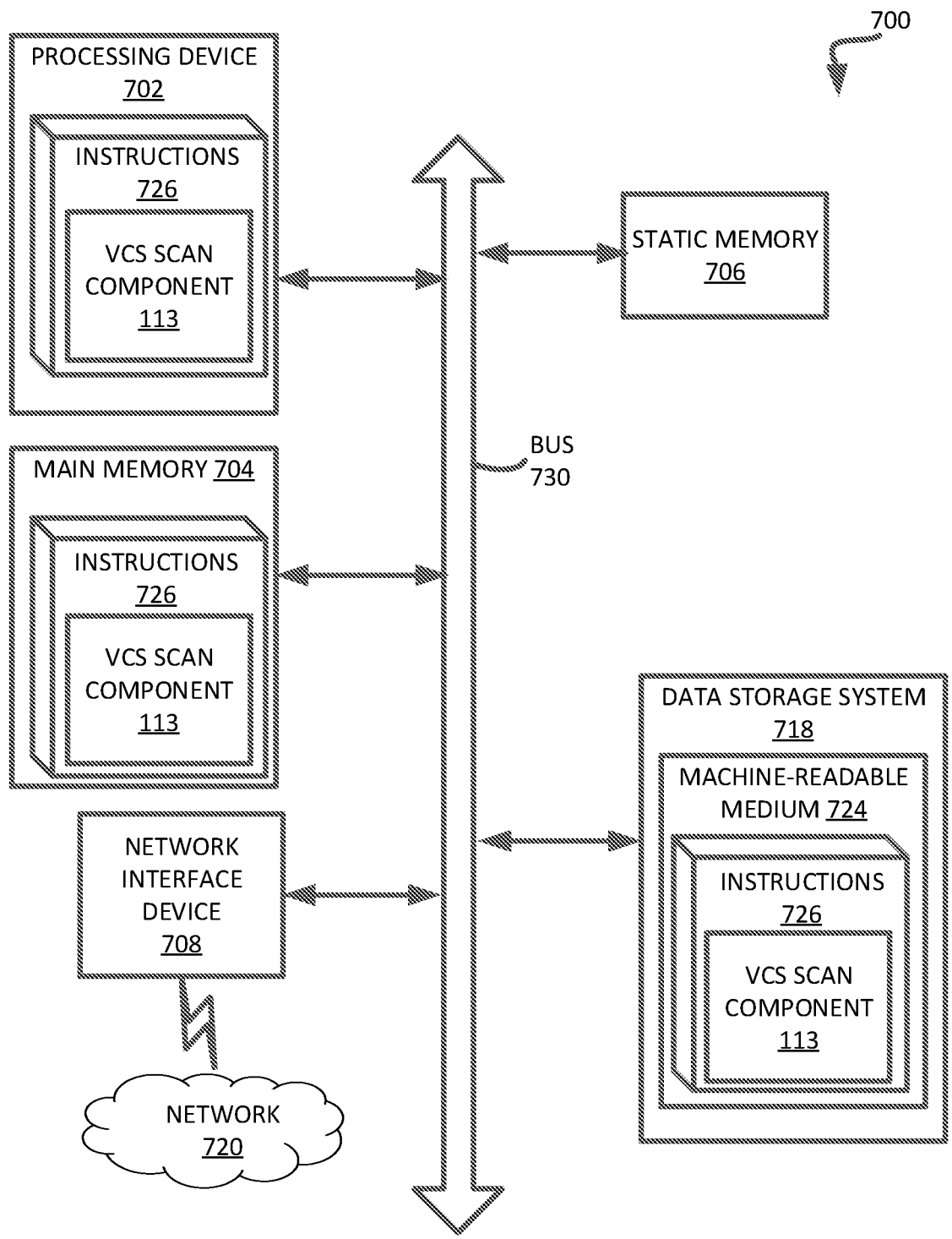
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the VCS component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 604 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a RBER scan component (e.g., the VCS component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
    a memory device; and
    a processing device, operatively coupled with the memory device, to perform operations comprising:
        initiating a voltage calibration scan;
        receiving a first value of a data state metric measured for a sample block of the memory device based on a first set of read voltage offsets associated with a first bin of blocks designed as a current bin, wherein the first value is designated as a minimum value of the data state metric;
        measuring a second value of the data state metric for the sample block based on a second set of read voltage offsets associated with a second bin of blocks having an index value higher than the current bin;
        determining that the second value exceeds the first value; and
        in response to determining that the second value exceeds the first value, maintaining the first bin as the current bin and stopping the voltage calibration scan.

2. The system of claim 1, wherein receiving the first value comprises measuring the first value.

3. The system of claim 1, wherein the operations further comprise storing the current bin in non-volatile memory prior to initiating the voltage calibration scan.

4. The system of claim 3, wherein the operations further comprise, after stopping the voltage calibration scan:
initiating a second voltage calibration scan; and
measuring a third value of the data state metric for the sample block based on a set of read voltage offsets associated with a third bin of blocks having an index value higher than the first bin.

5. The system of claim 4, wherein the operations further comprise:
determining that the third value does not exceed the first value; and
in response to determining that the third value does not exceed the first value, updating the current bin with the third bin and the minimum value with the third value.

6. The system of claim 1, wherein the current bin has an index value higher than at least one other bin.

7. The system of claim 1, wherein the data state metric is raw bit error rate (RBER).

8. The system of claim 1, wherein the data state metric is a distance to an optimal valley associated with a shifted threshold voltage distribution.

9. A method comprising:
initiating, by a processing device, a voltage calibration scan;
receiving, by the processing device, a first value of a data state metric measured for a sample block of a memory device associated with a first bin of blocks designated as a current bin, wherein the first value is designated as a minimum value;
measuring, by the processing device, a second value of the data state metric for the sample block based on a set of read voltage offsets associated with a second bin of blocks having an index value higher than the current bin;
determining, by the processing device, that the second value does not exceed the first value; and
in response to determining that the second value does not exceed the first value, updating, by the processing device, the current bin with the second bin and the minimum value with the second value.

10. The method of claim 9, wherein receiving the first value of the data state metric comprises measuring the first value.

11. The method of claim 9, further comprising storing, by the processing device, the current bin in non-volatile memory prior to initiating the voltage calibration scan.

12. The method of claim 9, further comprising, after updating the second bin as the current bin and the second value as the minimum value:
initiating, by the processing device, a second voltage calibration scan; and
measuring a third value of the data state metric for the sample block based on a set of read voltage offsets associated with a third bin of blocks having an index value higher than the second bin.

13. The method of claim 12, further comprising:
determining, by the processing device, that the third value exceeds the second value; and
maintaining, by the processing device, the second bin as the current bin in response to determining that the third value exceeds the second value.

14. The method of claim 9, wherein the data state metric is raw bit error rate (RBER).

15. The method of claim 9, wherein the data state metric is a distance to an optimal valley associated with a shifted threshold voltage distribution.

16. A non-transitory computer-readable storage medium comprising instructions that, when executed by a processing device, cause the processing device to perform operations comprising:
initiating a first voltage calibration scan;
receiving a first value of a data state metric measured for a sample block of a memory device based on a set of read voltage offsets associated with a first bin of blocks designed as a current bin, wherein the first value is designated as a minimum value of the data state metric;
measuring a second value of the data state metric for the sample block based on a set of read voltage offsets associated with a second bin of blocks having an index value higher than the current bin;
determining that the second value does not exceed the first value;
in response to determining that the second value does not exceed the first value, updating the second bin as the current bin and the second value as the minimum value;
initiating a second voltage calibration scan;
measuring a third value of the data state metric for the sample block based on a set of read voltage offsets associated with a third bin of blocks having an index value higher than the second bin;
determining that the third value exceeds the second value; and
in response to determining that the third value exceeds the second value, maintaining the second bin as the current bin and stopping the second voltage calibration scan.

17. The non-transitory computer-readable storage medium of claim 16, wherein receiving the first value of the data state metric comprises measuring the first value.

18. The non-transitory computer-readable storage medium of claim 16, wherein the operations further comprise storing the current bin in non-volatile memory prior to initiating the first voltage calibration scan.

19. The non-transitory computer-readable storage medium of claim 18, wherein the data state metric is at least one of raw bit error rate (RBER).

20. The non-transitory computer-readable storage medium of claim 16, wherein the data state metric is a distance to an optimal valley associated with a shifted threshold voltage distribution.

* * * * *